(12) United States Patent
Tsutsui et al.

(10) Patent No.: US 6,194,241 B1
(45) Date of Patent: *Feb. 27, 2001

(54) SEMICONDUCTOR LIGHT EMITTING DEVICE AND METHOD OF MANUFACTURING THE SAME

(75) Inventors: Tsuyoshi Tsutsui; Shunji Nakata; Yukio Shakuda; Masayuki Sonobe; Norikazu Itoh, all of Kyoto (JP)

(73) Assignee: Rohm Co., Ltd., Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/059,388

(22) Filed: Apr. 14, 1998

(51) Int. Cl.[7] .................................................. H01L 21/00
(52) U.S. Cl. .................................................. 438/46; 438/47
(58) Field of Search ............................ 257/94, 101, 103; 438/46, 47

(56) References Cited

U.S. PATENT DOCUMENTS 5,670,798 * 9/1997 Schetzina .............................. 257/96
5,693,963 * 12/1997 Fujimoto et al. ..................... 257/94

* cited by examiner

Primary Examiner—Olik Chaudhuri
Assistant Examiner—Douglas A. Wille
(74) Attorney, Agent, or Firm—Arent Fox Kintner Plotkin & Kahn, PLLC

(57) ABSTRACT

A semiconductor layered portion is formed of a gallium-nitride semiconductor overlying a substrate and having an n-type layer and a p-type layer to form a light emitting layer having a pn junction or a doublehetero junction. A gradient layer is provided at an interfacial portion between an lower layer and an upper layer of the semiconductor layered portion, wherein the gradient layer has a composition varied from a composition from said lower layer to a composition of the upper layer. With this structure, a semiconductor light emitting device which is excellent in light emitting efficiency is provided by reducing crystal lattice mismatch between semiconductor layers formed different in lattice constant on a substrate.

6 Claims, 2 Drawing Sheets

SEMICONDUCTOR LIGHT EMITTING DEVICE AND METHOD OF MANUFACTURING THE SAME

FIELD OF THE INVENTION

This invention relates to light emitting devices having, on a substrate, semiconductor layers that are different in lattice constant, providing a light emitting layer. More particularly, the invention relates to a semiconductor light emitting device and method of manufacturing the same adapted to reduce the effects by the mismatch of lattice constant between the semiconductor layers to thereby improve light emitting characteristics.

BACKGROUND OF THE INVENTION

There is a conventional semiconductor light emitting device formed by a gallium-nitride based compound semiconductor for emitting bluish (ultraviolet to yellow) light has a structure, for example, as shown in FIG. 4. That is, a sapphire substrate 21 has a low-temperature GaN buffer layer 22 and a high-temperature n-type GaN (cladding) layer 23 epitaxially grown thereon. On the n-type layer 23 is formed an active (light emitting) layer 24 of a material having a bandgap energy lower than that of the cladding layer so as to determine an emission-light wavelength, e.g. a compound semiconductor based on InGaN (having a variable ratio of In and Ga). A p-type (cladding) layer 25, having a compound semiconductor sublayer 25a and a GaN sublayer 25b, is formed on the active layer 24. A p-side electrode 28 is formed on a surface of the p-type layer 25, while an n-type electrode 29 is formed on the n-type layer 23 exposed by partly etching away the overlying semiconductor layers. Incidentally, the n-type layer may include an AlGaN-based semiconductor sublayer on an active layer 23 side in order to enhance carrier confining effects.

As stated above, the conventional bluish-light semiconductor light emitting device employing a gallium-nitride based compound semiconductor is formed by the layers overlaid on the sapphire substrate, which layers include those of a GaN-based compound semiconductor, an AlGaN-based compound semiconductor, InGaN-based compound semiconductor, and so on. However, sapphire has a lattice constant of 4.76 angstroms, and GaN has a lattice constant of 3.18 angstroms. $Al_{0.1}Ga_{0.9}N$, for example, has a lattice constant of 3.12 angstrom, and $In_{0.05}Ga_{0.95}N$ has 3.198 angstroms. Thus, these layers are different in lattice constant. These semiconductor layers, when formed overlying one another, tend to induce distortions of crystal lattice. This raises such problems that electric current is difficult to flow through the layers, and cracks are induced in the crystal reaching to the light emitting (active) layer, resulting in lower in light emitting efficiency. In particular, the n-type layer is formed thick, i.e. approximately 2–5 $\mu m$, on the sapphire substrate with a largely-different lattice constant through a thin low-temperature buffer layer. Therefore, the n-type layer tends to cumulate crystal distortions and ready to induce lattice mismatch therein.

SUMMARY OF THE INVENTION

It is therefore an object of the present invention to provide a semiconductor light emitting device which is excellent in light emitting efficiency by reducing crystal lattice mismatch between semiconductor layers formed different in lattice constant on a substrate.

It is another object to provide a method of manufacturing a semiconductor light emitting device by which a device with excellent light emitting efficiency is obtained by reducing crystal lattice mismatch between the semiconductor layers having different lattice constant formed on a substrate.

A semiconductor light emitting device according to the present invention, comprises: a substrate; a semiconductor layered portion formed of a gallium-nitride semiconductor overlying the substrate and having an n-type layer and a p-type layer to form a light emitting layer; and a gradient layer provided at an interfacial portion between an lower layer and an upper layer of the semiconductor layered portion, wherein the gradient layer has a composition varied from a composition from the lower layer to a composition of the upper layer.

This gradient layer can be structured by a semiconductor layer having a composition continuously varied or a thin-filmed multilayer structure having compositions varied step-wise. With this structure, the semiconductor layers different in lattice constant are out of direct interface with or interfaced with each other through a thin-filmed multilayer structure. Therefore, the composition of the gradient layer has a composition and hence lattice constant varied to prevent the crystal lattice to be mismatched. In order to prevent this lattice mismatch, the gradient layer is sufficiently provided in a thickness of approximately 1–700 nm, more preferably 1–300 nm. This range of the thickness does not influence on the difference in bandgap energy between the cladding layer and the active layer, preventing light emitting efficiency from degrading.

Here, the gallium-nitride based compound semiconductor means a semiconductor formed of a compound having a group-III element Ga and a group-V element N wherein part of the group-III element Ga may be substituted by other group-III elements such as Al and In, and/or part of the group-V element N may be substituted by other group-V elements such as P and As.

The semiconductor layered portion is preferably formed by a first-conductivity type cladding layer, an active layer, and a second-conductivity type cladding layer, and the gradient layer being provided between the active layer and the first-conductivity type layer and/or between the active layer and the second-conductivity type cladding layer. This prevents the crystallinity of the active layer and its vicinity, particularly, for a doublehetero junction structure from degrading due to the difference in lattice constant.

More specifically, the first-conductivity type cladding layer may be formed of GaN, the active layer of an InGaN-based compound semiconductor, and the second-conductivity type cladding layer of AlGaN-based compound semiconductor at least on a side of the active layer. Also, on a side opposite to the active layer with respect to the second-conductivity type cladding layer, a gradient layer may be formed in the second-conductivity type to have a composition varied from a AlGaN-based compound semiconductor to GaN, and a second-conductivity type GaN layer. Further, the substrate and the first-conductivity type cladding layer may have therebetween a low-temperature buffer layer deposited at a low temperature. With such structures, the semiconductor layered portion is improved in crystallinity.

A method of manufacturing a semiconductor light emitting device according to the present invention, comprises the steps of: growing a first-conductivity type cladding layer of a gallium-nitride based compound semiconductor on a substrate by an MOCVD method; growing a gradient layer while varying a composition thereof continuously or stepwisely such that the composition gradually approaches from a composition of the first-conductivity type cladding layer to a composition of an active layer formed of a gallium-nitride based compound semiconductor having a bandgap energy lower than that of the first-conductivity type cladding layer so as to determine an emission light wavelength; forming an active layer continuously after the gradient layer reaches the composition of the active layer; and growing a second-conductivity type cladding layer on the active layer.

A further gradient layer may be formed while varying a composition thereof continuously or stepwisely such that the composition is varied from the composition of the active layer to a composition of the second-conductivity type cladding layer, the second-conductivity type cladding layer being grown on the further cladding layer.

In the MOCVD method, the gradient layer may be formed while gradually increasing a flow rate of a reacting gas being supplied over a semiconductor layer as the gradient layer being grown or gradually varying a temperature without varying the flow rate. Where using In, it is more sensitive to temperature variation than flow-rate change so that temperature change is easier to control. Also, a low-temperature buffer layer may be deposited of a gallium-nitride based compound semiconductor at a low temperature of not allowing epitaxial growth before growing the first-conductivity type cladding layer.

A method of manufacturing a semiconductor light emitting device according to another form of the present invention, comprises the steps of: forming rises on a substrate by using a same material as that of a low-temperature buffer layer, and then depositing a semiconductor layer to thereby provide a low-temperature buffer layer; growing a first-conductivity type semiconductor layer on the first-conductivity type semiconductor layer on the low-temperature buffer layer; and growing a semiconductor layered portion on the first-conductivity type semiconductor layer to include a second-conductivity semiconductor layer which cooperates with the first-conductivity type semiconductor layer to form a light emitting layer. Rises may be formed using a first-conductivity semiconductor before growing the first-conductivity type semiconductor layer, and then growing the first-conductivity type semiconductor layer.

By forming the rises, crystal lattice mismatch due to the difference in lattice constant is absorbed to thereby improve the crystallinity of the semiconductor layers.

More specifically, the semiconductor layered portion may be formed by a first-conductivity type cladding layer, an active layer, and a second-conductivity type cladding layer. Also, the semiconductor layered portion may be formed by a gallium-nitride based compound semiconductor. Further, a further gradient layer may be provided between the first-conductivity type cladding layer and the active layer such that a composition thereof is varied from a composition of the first-conductivity type cladding layer to a composition of the active layer. With such structures, the semiconductor layered portion is improved in crystallinity.

For a fuller understanding of the nature and advantages of the invention, reference should be made to the ensuing detailed description taken in conjunction with the accompanying drawings.

DETAILED DESCRIPTION

Figure 1:
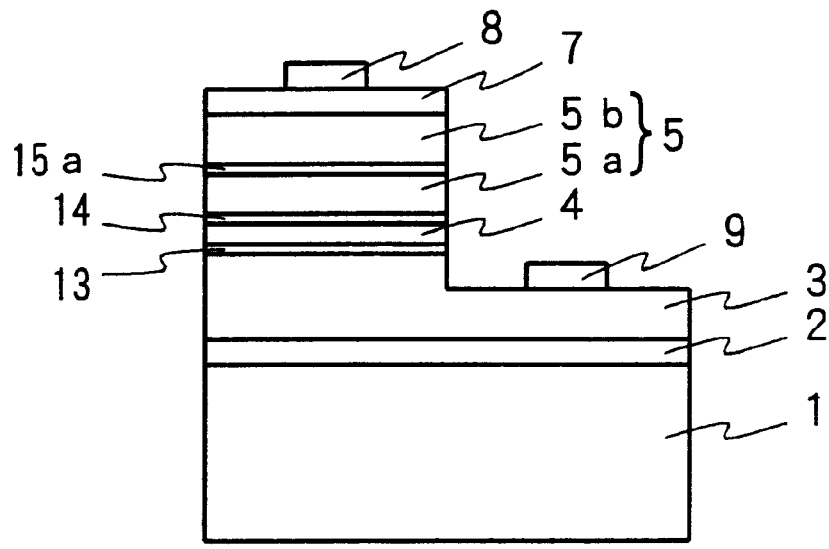
FIG. 1 is an explanatory sectional view of a semiconductor light emitting device according to one embodiment of the present invention, formed of gallium-nitride based compound semiconductor layer on a sapphire substrate in a manner suited for emitting, for example, bluish light.

Referring to FIG. 1, a semiconductor light emitting device according to the present invention includes a substrate 1 formed, for example, of sapphire ($Al_2O_3$ single crystal). The substrate 1 has thereon semiconductor layers 2–5 for providing a light emitting layer. The semiconductor layers 2–5 has gradient layers 13, 14, 15a formed between the adjacent ones thereof to have a composition varied to the composition of the succeeding upper layer. The semiconductor layers has thereon a diffusion metal layer 7 on which a p-side electrode 8 is formed in electric contact with the diffusion metal layer. On the other hand, an n-side electrode 9 is formed in electric contact with the n-type layer 3 exposed by partly removing the semiconductor layers 3, 4, 5, 13, 14, 15a.

The semiconductor layers overlying the substrate 1 includes a low-temperature buffer layer 2 formed by deposition to a thickness of approximately 0.01–0.2 μm, and an n-type GaN (cladding) layer 3 grown to a thickness of approximately 1–5 μm. The n-type layer 3 has, on a surface, a gradient layer 13 formed to a thickness of approximately 1–700 nm. The gradient layer has a composition with an In crystal-mixture ratio gradually increased to a composition of a succeeding active layer. The method of growing the gradient layer will be described in detail later.

The active layer 4 on the gradient layer 13 is formed of a material having a bandgap energy greater than that of the cladding layer to determine a desired emission-light wavelength, e.g. $In_xGa_{1-x}N$ ($0 \leq x < 1$, e.g. x=0.05). The active layer 4 has a thickness of approximately 0.005–0.3 μm. On a surface of the active layer, a gradient layer 14 is formed to have a composition having a crystal-mixture ratio of In gradually decreased and Al gradually increased to an AlGaN-based compound semiconductor of a succeeding p-type layer. The gradient layer 14 has a thickness of approximately 1–700 nm.

The gradient layer 14 has thereon an AlGaN-based compound semiconductor layer 5a to a thickness of 0.1–0.5 μm, on which a gradient layer 15a is further formed, to a thickness of 1–700 nm, in a composition having an Al crystal-mixture ratio gradually decreased to that of a succeeding GaN layer 5b having a thickness of approximately 0.1–0.5 μm. Note that the gradient layers are preferably formed as thin as approximately 1–30 nm, more preferably approximately 1–100 nm.

Incidentally, the p-type layer 5 was formed by a double-layer structure having the GaN sublayer 5b and the AlGaN-based compound semiconductor sublayer 5a. This is because the Al-containing layer is desirably provided on a side of the active layer 4 in order to enhance carrier confinement. However, the p-type layer 5 may be constituted by a single GaN layer. On the other hand, the n-type layer 3 may be constituted by a double-layer structure having an AlGaN-based compound semiconductor layer, or otherwise the n-type layer 3 may be formed by another gallium-nitride based compound semiconductor layer. Meanwhile, the active layer 4 was formed by using $In_xGa_{1-x}N$. However, the active layer 4 may use a gallium-nitride based compound semiconductor generally expressed by $In_pAl_qGa_{1-p-q}N$ ($0 \leq p<1$, $0 \leq q<1$, $0 \leq p+q<1$) in conformity to a desired wavelength of emission light.

The semiconductor light emitting device of the present invention is characterized by the gradient layers each provided at a heterostructure junction of adjacent ones of the semiconductor layers different in composition such that the composition thereof gradually varies between the compositions of the adjacent semiconductor layers. In this manner, the gradient layer is interposed between the semiconductor layers to have a lattice constant that is gradually varied without having an interface of layers greatly different in lattice constant. As a result, the semiconductor layers are free from abrupt change in lattice constant and hence mismatch in lattice constant, offering excellent crystallinity. Meanwhile, the gradient layer 13 is interposed between the active layer 4 and the n-type layer 3 so as to have a bandgap energy intermediate between these two layers. However, the gradient layer is as thin as approximately 1–700 nm, giving no influence onto the carrier confinement effect. This is true for the other gradient layers. Thus, the semiconductor layer has no abrupt change of lattice constant, providing excellent crystallinity with layers overlying one another. These gradient layers does not give adverse affects on optical characteristics, and the resulting device will be enhanced in brightness.

Figure 2:
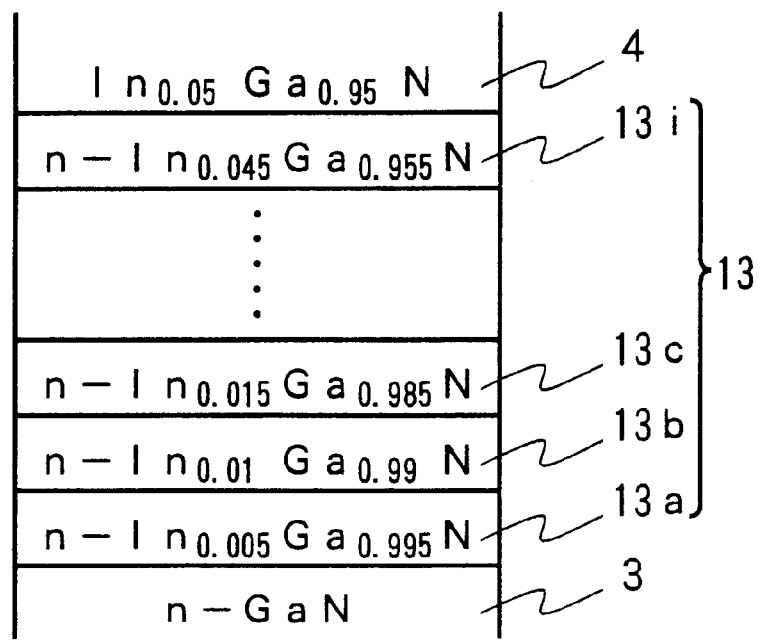
FIG. 2 is a view showing a modification to a gradient layer portion of FIG. 1.

The embodiment of FIG. 1 was formed by the gradient layers 13, 14, 15a, wherein the composition thereof is varied continuous from the composition of the preceding lower layer to the succeeding upper layer. However, the gradient layer may be a multilayered structure formed by thin-filmed sublayers so that the composition of the thin-filmed layer is varied stepwise, as illustrated by a modification of the gradient layer 13 in FIG. 2. With this structure, the semiconductor layers are also free of lattice mismatch because the thin-filmed sublayers are reduced in difference of composition between adjacent ones thereof. In this example, the gradient layer 13 is formed by a thin-filmed multilayer structure having nine thin layers 13a, 13b, . . . , 13i each having a thickness of 10 nm so that the thin layer has an In composition increased by 0.005 from the GaN n-type layer 3 up to an $In_{0.05}Ga_{0.95}N$. Note that, where the n-type layer 3 is formed of an AlGaN-based compound semiconductor, the composition of the thin layer is varied by increasing the ratio of In with decrease in Al ratio thereof, as stated before. The gradient layer 14 between the active layer 4 and the AlGaN-based compound semiconductor layer 5a may be formed by varying the composition reversal to that stated before. Other gradient layers may be structured in the similar manner.

In the FIG. 1 embodiment, the gradient layers were provided for every heterojunction given between adjacent ones of the semiconductor layers. However, the gradient layers are not necessarily provided for all the heterojunctions. That is, the gradient layers can be effectively applied to such a particular portion as an interface of semiconductor layers with large lattice mismatch or an interface of those close to the active layer where crystallinity is critical for providing optical properties.

Explanations will now be made for a method of manufacturing a semiconductor light emitting device of FIG. 1.

First, a low-temperature buffer layer 2 is formed to at a low temperature of approximately 400–600° C. to a thickness of approximately 0.01–0.2 μm on a substrate 1, for example, of sapphire, by supplying, according to an metal-organic chemical vapor deposition (MOCVD) method, reacting gasses of trimethylegallium (TMG), ammonia ($NH_3$) and an n-dopant $SiH_4$ gas, together with an $H_2$ carrier gas.

Then, an n-type layer 3 is formed at a high temperature of approximately 600–1200° C. to a thickness of 1–5 μm, by using the above reacting gases. A gradient layer 13 is then formed to a thickness of approximately 1–300 nm by gradually increasing the flow rate of trimethyleindium (heinafter referred to as TMIn) in a manner such that the In composition of the layer being formed approaches that for the active layer 4. In this case, the decrease of reacting temperature, even if the flow rate of TMIn is kept constant, increases the In crystal-mixture ratio. Accordingly, the composition of In may be gradually increased by decreasing the reacting temperature with the flow rate kept constant or varied. Thereafter, the dopant gas is switched off to form an $In_xGa_{1-x}N$ active layer 4 to a thickness of 0.05–0.3 μm. Then, a gradient layer 14 is formed to a thickness of 1–300 nm such that the composition of the layer being formed approaches the AlGaN-based compound semiconductor for a p-type layer 5, by gradually decreasing the flow rate of TMIn (or the reacting temperature is increased with the TMIn flow rate kept as it is) while increasing the flow rate of trimethylealuminum (hereinafter referred to as TMA).

Thereafter, the dopant gas is switched to cyclopentadienylmagnesium ($Cp_2Mg$) or dimethylezinc (DMZn) to grow an AlGaN-based compound semiconductor layer 5a to a thickness of approximately 1–0.5 μm. Decreasing gradually the flow rate of TMA to finally 0, a gradient layer 15a is grown to a thickness of approximately 1–300 nm. The growth is continued by maintaining the supply of the reacting gas to grow a GaN to a thickness of approximately 0.1–0.5 μm to thereby provide a p-type layer 5 with a total thickness of approximately 0.2–1 μm.

Thereafter metals, for example, of Ni and Au are evaporated and sintered to form a diffusion metal layer 7 in a thickness of approximately 5 nm. The semiconductor layers formed are partly etched away by reactive ion etching using a reactive gas such as a chlorine gas mixed in an inert gas such as an argon gas, to provide a p-side electrode 8 and an n-side electrode 9. As a result, a semiconductor light emitting device as shown in FIG. 1 is obtained.

Incidentally, where the gradient layer 13, 14, 15a is formed by a thin-filmed layer in the manufacture process, a thin-filmed multilayer structure having a gradually-varied composition is obtained by stepwisely varying the flow rate of the reacting gas instead of continuously varying the flow rate of the reacting gas or the reacting temperature.

Figure 3:
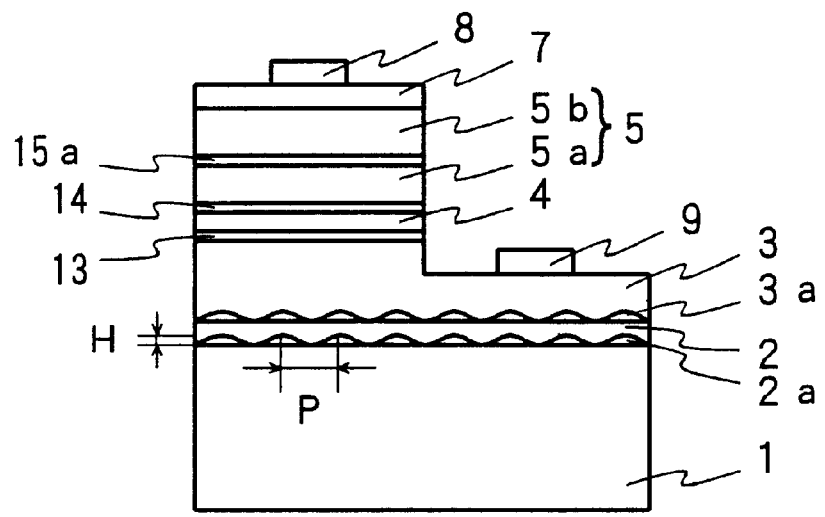
FIG. 3 is a view for explaining another embodiment of manufacturing a semiconductor light emitting device of the present invention.
Figure 4:
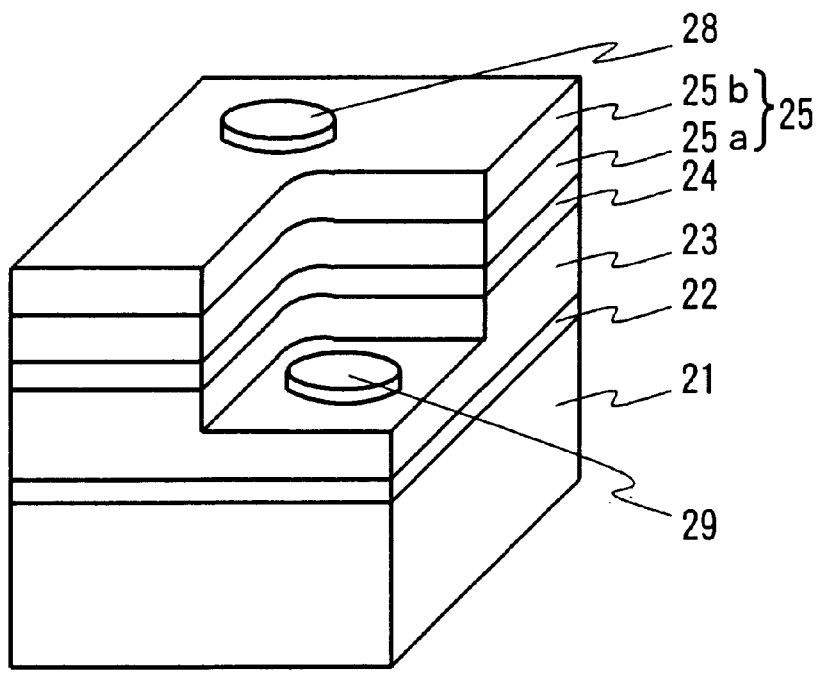
FIG. 4 is an explanatory perspective view showing one example of a conventional semiconductor light emitting device.

Referring to FIG. 3, there is illustrated an explanatory sectional view of a semiconductor light emitting device according to the present invention. This embodiment has rises in a roughened-surface form which have been formed at an initial stage of growing on a preceding layer (or substrate) a succeeding semiconductor layer different in composition therefrom in order to provide the succeeding layer. The present inventor has found in this method that crystal lattice mismatch is absorbed by the rises to prevent crystal distortions from occurring. The method of forming rises is particularly effective where a semiconductor layer such as a low-temperature buffer layer 2 is not matched in lattice constant to a sapphire substrate 1 or where the semiconductor layers, even if same in composition, tend to have crystal lattice mismatch at an interface, such as in the low-temperature buffer layer 2 and the n-type layer 3, due to significant difference in growth temperature. However, this structure is also applicable to the other semiconductor layer interfaces.

In the FIG. 3 embodiment, when a low-temperature buffer layer 2 or an n-type layer 3 is started to grow, rises 2a, 3a in a roughened-surface form are first formed. The rises 2a, 3a are in a height H of approximately 40–50 nm and a pitch P of approximately 70–80 μm. To provide rises 2a, 3a, a semiconductor layer is started to grow at a temperature higher than a usual temperature for growing the same layer. For example, a low-temperature buffer layer 2, when formed on a sapphire substrate 1, is usually grown at a temperature of approximately 400–600° C. In this method, however, rises 2a are provided at a first growth stage by starting to form a layer at a temperature of approximately 600–1000° C. Then the temperature within the MOCVD reactor is lowered down to a temperature of approximately 400–600° C. to continue the growth while filling valleys between rises 2a, thereby providing a flattened layer surface. To provide rises 3a at a beginning of growing an n-type layer, the layer growth is started at a temperature of approximately 800–1000° C. Then the growth temperature is lowered to approximately 600–800° C. or otherwise a low-temperature buffer layer is formed again at a temperature of growing a low-temperature buffer layer. Thus, the layer growth is done also at valleys to thereby provide a flattened layer surface. Although the rises 2a, 3a disappears by crystallization into the layer upon forming a usual n-type layer, they contribute to prevent against mismatch in crystal lattice.

According to the present invention, even where a semiconductor light emitting device has overlying semiconductor layers different in lattice constant, the semiconductor layers are almost free from lattice distortions by providing composition-varied gradient layers or rises therebetween, thus enhancing carrier mobility. The resulting semiconductor light emitting device has an improved light emission efficiency and high characteristics.

Although preferred embodiments have been described in some detail, it is to be understood that certain changes can be made by those skilled in the art without departing from the spirit and scope of the invention as defined by the appended claims.

What is claimed is:

1. A method of manufacturing a semiconductor light emitting device, comprising the steps of:

forming rises on a substrate by using a same material as that of a low-temperature buffer layer, and then depositing a semiconductor layer to thereby provide a low-temperature buffer layer;

growing a first-conductivity type semiconductor layer on said first-conductivity type semiconductor layer on said low-temperature buffer layer; and growing a semiconductor layered portion on said first-conductivity type semiconductor layer to include a second-conductivity semiconductor layer which cooperates with said first-conductivity type semiconductor layer to form a light emitting layer.

2. A manufacturing method according to claim 1, further comprising:

forming rises on the low-temperature buffer layer by using a same material as that of said first-conductivity layer before growing said first-conductivity type semiconductor layer, and then growing said first-conductivity layer.

3. A manufacturing method according to claim 1, wherein said semiconductor layered portion is formed by a first-conductivity type cladding layer, an active layer, and a second-conductivity type cladding layer.

4. A manufacturing method according to claim 3, said semiconductor layered portion is formed by a gallium-nitride based compound semiconductor.

5. A manufacturing method according to claim 4, further comprising a step of forming a gradient layer between said first-conductivity type cladding layer and said active layer such that a composition thereof is varied from a composition of said first-conductivity type cladding layer to a composition of said active layer.

6. A method of manufacturing a semiconductor light emitting device, comprising the steps of:

depositing a semiconductor layer on a substrate at a low temperature to provide a low-temperature buffer layer;

forming rises using a semiconductor having the same composition of that of a first-conductivity type semiconductor layer to be grown and then growing said first-conductivity-type semiconductor layer; and growing a semiconductor layered portion including a second-conductivity type semiconductor layer and cooperating with said first-conductivity semiconductor layer to form a light emitting layer.

* * * * *